US006538318B2

(12) United States Patent
Nagareda et al.

(10) Patent No.: US 6,538,318 B2
(45) Date of Patent: Mar. 25, 2003

(54) SEMICONDUCTOR CERAMIC FOR THERMISTORS AND CHIP-TYPE THERMISTOR INCLUDING THE SAME

(75) Inventors: Kenji Nagareda, Shiga-ken (JP); Kenjirou Mihara, Yokaichi (JP); Hideaki Niimi, Hikone (JP); Yuichi Takaoka, Shiga-ken (JP)

(73) Assignee: Murata Manufacturing, Co., Ltd., Kyoto-fu (JP)

( * ) Notice: Subject to any disclaimer, the term of this patent is extended or adjusted under 35 U.S.C. 154(b) by 0 days.

(21) Appl. No.: 10/017,079

(22) Filed: Dec. 14, 2001

(65) Prior Publication Data

US 2002/0121696 A1 Sep. 5, 2002

(30) Foreign Application Priority Data

Dec. 26, 2000 (JP) .......................................... 2000-395481

(51) Int. Cl.[7] .......................... H01L 23/06; H01L 23/10; H01L 23/15

(52) U.S. Cl. ........................................ 257/703; 438/125

(58) Field of Search ............................ 257/43, 700–707, 257/59; 501/152, 154; 438/85–86, 125, 122

(56) References Cited

U.S. PATENT DOCUMENTS 3,790,840 A * 2/1974 Toyoda ........................ 250/207
4,231,902 A * 11/1980 Yu ........................ 252/519.5
4,290,041 A * 9/1981 Utsumi et al. ................ 338/21
4,959,262 A * 9/1990 Charles et al. ........... 156/89.17
5,084,426 A * 1/1992 Iwaya et al. ............. 252/520.2
5,246,628 A * 9/1993 Jung et al. ............... 252/519.5
5,720,859 A * 2/1998 Czubarow et al. ..... 204/157.43
6,143,207 A * 11/2000 Yamada et al. .......... 252/518.1
6,210,625 B1 * 4/2001 Matsushita et al. ......... 264/109
6,218,928 B1 * 4/2001 Okada et al. ............. 338/22 R

* cited by examiner

*Primary Examiner*—Phat X. Cao
*Assistant Examiner*—Thao X. Le
(74) *Attorney, Agent, or Firm*—Dickstein, Shapiro, Morin & Oshinsky, LLP.

(57) ABSTRACT

A semiconductor ceramic for thermistors contains zinc oxide and titanium oxide as main components and a predetermined content of manganese. Also, a chip-type thermistor including the semiconductor ceramic is provided. By adding manganese, the resistance-temperature characteristic is controllable in the range of positive temperature coefficient to negative temperature coefficient. Also, by adding nickel, the resistivity is controllable. As a result, a thermistor material which provides a series of semiconductor ceramics having various resistivities and various B constants in a low range, for example 0 to 1,000 K, is available.

14 Claims, 1 Drawing Sheet

SEMICONDUCTOR CERAMIC FOR THERMISTORS AND CHIP-TYPE THERMISTOR INCLUDING THE SAME

BACKGROUND OF THE INVENTION

1. Field of the Invention

The present invention generally relates to a semiconductor ceramic for thermistors (hereinafter referred to as thermistor semiconductor ceramic) which is used as a temperature-compensating element for electronic devices, and more particularly to a thermistor semiconductor ceramic containing zinc oxide and titanium oxide as main components, and to a chip-type thermistor including the thermistor semiconductor ceramic.

2. Description of the Related Art

A temperature-sensitive resistance element such as a positive temperature coefficient thermistor or a negative temperature coefficient thermistor is conventionally used as a temperature-compensating element in electronic devices.

Although a semiconductor oxide or a semiconductor metal is normally used for such a temperature-sensitive resistance element, only temperature-sensitive resistance elements made of a thermistor material having a B constant of about 1,500 K or more are available.

When a temperature-sensitive resistance element having a B constant of less than the above value is required, the above conventional element is connected in parallel to a fixed resistor. The B constant consequently decreases in the combination of the element and the resistor, so that the combination functions as the temperature-compensating element having the desired resistance-temperature characteristic.

However, when the temperature-compensating element is connected in parallel to the fixed resistor, the following problems arise: increasing cost due to the additional components; and difficulty in miniaturizing electronic devices including the element and the resistor due to the amount of space required for the resistor.

In order to solve the above problems, first, improving the known materials of the thermistor has been proposed. However, it is not necessarily easy to decrease the B constant by using known thermistor materials.

Secondly, decreasing the B constant by varying the composition ratio of the thermistor materials has been proposed. This method, however, has a problem in that the reliability of the temperature-compensating element decreases. Also, only by varying the composition ratio of the thermistor material, it is difficult to obtain a thermistor material which provides a series of elements having various B constants in a low range, for example 0 to 1,000 K. A material having sufficient reliability in practical use has not yet been developed.

SUMMARY OF THE INVENTION

Accordingly, it is an object of the present invention to provide a semiconductor ceramic which is suitable for thermistors having a B constant in a low range, for example 0 to 1,000 K, and a chip-type thermistor including the thermistor semiconductive ceramic.

In order to achieve the above object, a thermistor semiconductor ceramic contains zinc oxide and titanium oxide which are main components and a predetermined content of manganese.

Adding manganese to the thermistor semiconductor ceramic of which the main components are zinc oxide and titanium oxide (normally a mixed crystal composed of ZnO and $Zn_2TiO_4$) varies the resistance-temperature characteristic. The characteristic is controllable in the range of positive temperature coefficient to negative temperature coefficient according to the manganese content, so that thermistor materials which provide a series of thermistor semiconductive ceramics having various B constants are available. Also, the thermistor semiconductor ceramic is suitable for various applications.

When the thermistor semiconductor ceramic contains manganese in the range of about 0.001 to 10 mol %, the resistance-temperature characteristic is reliably controllable so that thermistor semiconductor ceramics having desired characteristics are available.

A thermistor semiconductor ceramic having a positive resistance-temperature characteristic is available when the manganese content is about 0.5 mol % or less, and a thermistor semiconductor ceramic having a negative resistance-temperature characteristic is available when the manganese content is about 0.5 mol % or more.

Controlling the manganese content provides a series of thermistor semiconductor ceramics having various B constants in a low and wide range of 0 to 1000 K.

When the thermistor semiconductor ceramic contains a predetermined content of nickel, the resistivity is controllable so that a series of thermistor semiconductor ceramics having various resistivities are available.

When the nickel content is preferably in the range of about 0.1 to 20 mol %, a series of thermistor semiconductor ceramics having a resistivity in the range of 1 to 1,000 Ω·cm, which is useful in practice, are available.

A chip-type thermistor includes a thermistor element comprising the semiconductor ceramic and electrodes provided on the thermistor element.

When the electrodes are provided on the thermistor element comprising the semiconductor ceramic, a chip-type thermistor having a B constant in a low range of 0 to 1000 K, for example, can be provided.

DESCRIPTION OF THE PREFERRED EMBODIMENTS

Figure 1:
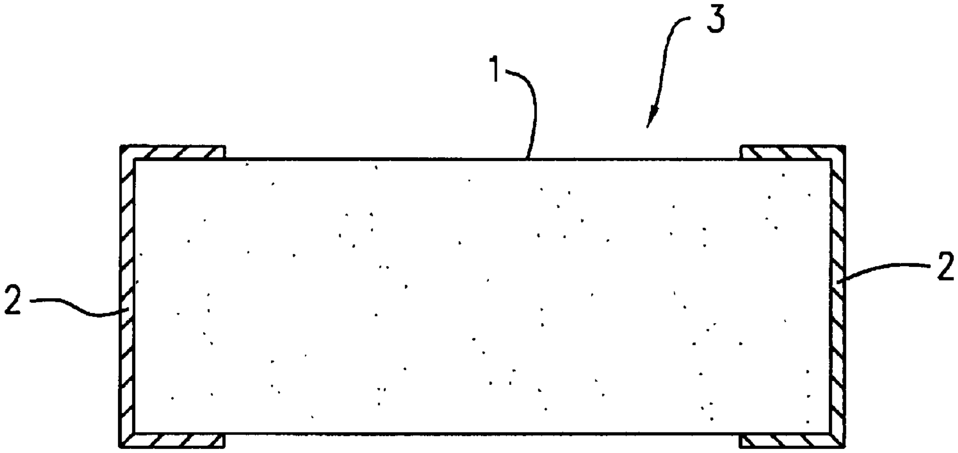
FIG. 1 is a sectional view showing a chip-type thermistor comprising a thermistor semiconductor ceramic according to an embodiment of the present invention.

The present invention will be described in detail bellow with reference to examples.

EXAMPLE 1

Chip-type thermistors were prepared and the characteristics (resistivity and resistance-temperature characteristics) thereof were measured according to the following procedures.

Preparation of Chip-type Thermistors (1) Powdered zinc oxide, titanium oxide and manganese oxide were combined to make the compositions of thermistor semiconductor ceramics shown in Table 1.

(2) The resulting powder mixture, pure water, zirconia balls and a binder were placed into a polyethylene pot, and then mixed for 15 hours to form a slurry.

(3) The slurry was applied onto a substrate to form a sheet having a thickness of 50 μm.

(4) The sheet was cut at predetermined dimensions, and then 10 to 20 cut sheets were stacked and pressed to form a green laminate.

(5) The green laminate was cut at predetermined dimensions, and then the cut green laminate was fired at 1,250 to 1,500° C. for 2 hours to form a fired laminate (thermistor semiconductor ceramic).

(6) External electrodes were formed on both ends of the fired laminate by sputtering. As shown in FIG. 1, a chip-type thermistor 3 having a pair of external electrodes 2 on both ends of ceramic 1 was provided.

Although thin-film electrodes were formed as external electrodes by sputtering in EXAMPLE 1, the external electrodes may be formed by any method. The type of the external electrode is not limited to the thin-film electrode and may be a so-called thick-film electrode which is formed by applying and baking a conductive paste.

Measurement and Evaluation of Characteristics

The characteristics (resistivity and resistance-temperature characteristics) of the chip-type thermistor were measured. The resistivity at 25° C. and the B constant are shown in Table 1. The B constant was determined according to the resistivity at 25° C. and 50° C. Samples with an asterisk are comparative examples which are outside the scope of the present invention.

TABLE 1

| | Composition | | | | Characteristic | |
|---|---|---|---|---|---|---|
| Sample | Zn (mol %) | Ti (mol %) | Mn (mol %) | Ni (mol %) | Resistivity (Ω · cm) | B constant (K) |
| 1* | 86 | 14 | 0 | 0 | 3.0 × $10^1$ | −760 |
| 2* | 86 | 13.9999 | 0.0001 | 0 | 3.0 × $10^1$ | −760 |
| 3 | 86 | 13.999 | 0.001 | 0 | 2.6 × $10^1$ | −700 |
| 4 | 86 | 13.99 | 0.01 | 0 | 2.5 × $10^1$ | −640 |
| 5 | 86 | 13.95 | 0.05 | 0 | 2.3 × $10^1$ | −500 |
| 6 | 86 | 13.9 | 0.1 | 0 | 3.5 × $10^1$ | −450 |
| 7 | 86 | 13.5 | 0.5 | 0 | 2.4 × $10^2$ | 290 |
| 8 | 85 | 14 | 1 | 0 | 4.1 × $10^3$ | 1500 |
| 9 | 85 | 13.5 | 1.5 | 0 | 1.6 × $10^4$ | 2400 |
| 10 | 85 | 13 | 2 | 0 | 5.3 × $10^4$ | 3500 |
| 11 | 83 | 12 | 5 | 0 | 6 × $10^5$ | 5000 |
| 12 | 80 | 10 | 10 | 0 | 1 × $10^6$ | 5500 |
| 13* | 79 | 9 | 12 | 0 | 1 × $10^7$ | — |
| 14* | 77 | 8 | 15 | 0 | 1 × $10^7$ | — |

Table 1 shows the following result:

Sample 1 that contains zinc oxide and titanium oxide but does not contains manganese had a resistivity of 30 Ω·cm and a B constant of −760 K, thus showing a positive resistance-temperature characteristic. The B constant increases according to the manganese content. The resistivity initially decreases and then after the Mg content increases above about 0.05 mol %, the resistivity increases.

The above result means that the resistivity and the B constant are controllable by varying the manganese content in the composition of the semiconductor ceramic in which zinc oxide and titanium oxide are main components. In particular, the B constant increases from a negative value to a positive value according to the manganese content, so that the resistance-temperature characteristic is varied over a wide range from a negative value to a positive value.

Also, the manganese content that is effective in controlling the B constant and the resistivity is in the range of 0.001 to 10 mol %. If the manganese content is less than about 0.001 mol % (Sample 2), the B constant and the resistivity thereof are the same as those of Sample 1 which does not contain manganese. If the manganese content is more than about 10 mol % (Samples 13 and 14), the resistivity is too large and thus the samples do not function as resistor elements.

EXAMPLE 2

Powdered zinc oxide, titanium oxide, manganese oxide and nickel oxide were combined to make compositions of thermistor semiconductor ceramics shown in Table 2.

Chip-type thermistors were prepared with the resulting powder mixture according to the same procedure as EXAMPLE 1. Characteristics (resistivity and resistance-temperature characteristics) of the samples are shown in Table 2.

TABLE 2

| | Composition | | | | Characteristic | |
|---|---|---|---|---|---|---|
| Sample | Zn (mol %) | Ti (mol %) | Mn (mol %) | Ni (mol %) | Resistivity (Ω · cm) | B constant (K) |
| 15* | 86 | 13.90 | 0.05 | 0.05 | 2.3 × $10^1$ | −500 |
| 16 | 86 | 13.85 | 0.05 | 0.1 | 5.6 × $10^0$ | −480 |
| 17 | 83 | 11.95 | 0.05 | 5 | 9.6 × $10^0$ | −440 |
| 18 | 80 | 9.95 | 0.05 | 10 | 2.0 × $10^0$ | −430 |
| 19 | 77 | 7.95 | 0.05 | 15 | 1.3 × $10^0$ | −430 |
| 20 | 74 | 5.95 | 0.05 | 20 | 8.0 × $10^{-1}$ | −420 |
| 21* | 71 | 3.95 | 0.05 | 25 | 7.0 × $10^{-1}$ | −410 |
| 22* | 86 | 13.85 | 0.1 | 0.05 | 4.8 × $10^1$ | −460 |
| 23 | 86 | 13.8 | 0.1 | 0.1 | 4.0 × $10^1$ | −450 |
| 24 | 83 | 11.9 | 0.1 | 5 | 2.6 × $10^1$ | −300 |
| 25 | 80 | 9.9 | 0.1 | 10 | 6.9 × $10^0$ | −300 |
| 26 | 77 | 7.9 | 0.1 | 15 | 1.8 × $10^0$ | −290 |
| 27 | 74 | 5.9 | 0.1 | 20 | 1.3 × $10^0$ | −290 |
| 28* | 71 | 3.9 | 0.1 | 25 | 6.9 × $10^{-1}$ | −310 |
| 29* | 86 | 13.45 | 0.5 | 0.05 | 1.8 × $10^2$ | 300 |
| 30 | 86 | 13.4 | 0.5 | 0.1 | 2.4 × $10^2$ | 270 |
| 31 | 83 | 11.5 | 0.5 | 5 | 3.5 × $10^1$ | 110 |
| 32 | 80 | 9.5 | 0.5 | 10 | 7.8 × $10^0$ | 90 |
| 33 | 77 | 7.5 | 0.5 | 15 | 6.5 × $10^0$ | 80 |
| 34 | 74 | 5.5 | 0.5 | 20 | 6.6 × $10^0$ | 80 |
| 35* | 71 | 3.5 | 0.5 | 25 | 6.6 × $10^0$ | 80 |
| 36* | 86 | 13.85 | 1 | 0.05 | 3.5 × $10^3$ | 70 |
| 37 | 85 | 13.9 | 1 | 0.1 | 4.1 × $10^3$ | 1500 |
| 38 | 82 | 12 | 1 | 5 | 2.0 × $10^3$ | 1500 |
| 39 | 79 | 10 | 1 | 10 | 1.5 × $10^3$ | 1400 |
| 40 | 76 | 8 | 1 | 15 | 1.4 × $10^3$ | 1400 |
| 41 | 73 | 6 | 1 | 20 | 1.3 × $10^3$ | 1400 |
| 42* | 71 | 3 | 1 | 25 | 1.3 × $10^3$ | 1400 |

Table 2 shows that addition of nickel decreases the resistivity by 1 to 2 orders of magnitude in the semiconductor ceramics containing zinc oxide and titanium oxide as main components and manganese as a subcomponent.

The nickel content that is effective in controlling the resistivity is in the range of about 0.1 to 20 mol %. When the nickel content is outside the above range, the required resistivity is not achieved.

The present invention is not limited to the embodiments described above, and within the scope of the present invention, various modifications and various changes may be made in terms of firing conditions, composition of the material compound, and so on.

What is claimed is:

1. A semiconductor ceramic for thermistors, comprising a main component comprising a mixed crystal of ZnO and $Zn_2TiO_4$; and 0.001 to 10 mol % of manganese.

2. A semiconductor ceramic for thermistors according to claim 1, wherein the manganese content is about 0.5 mol % or below such that the ceramic has a positive resistance-temperature coefficient.

3. A semiconductor ceramic for thermistors according to claim 1, wherein the manganese content is about 0.5 mol % or above such that the ceramic has a negative resistance-temperature coefficient.

4. A semiconductor ceramic for thermistors according to claim 1, further comprising about 0.1 to 20 mol % of nickel.

5. A semiconductor ceramic for thermistors according to claim 4, wherein the manganese content is about 0.5 mol % or below such that the ceramic has a positive resistance-temperature coefficient.

6. A semiconductor ceramic for thermistors according to claim 4, wherein the manganese content is about 0.5 mol % or above such that the ceramic has a negative resistance temperature coefficient.

7. A semiconductor ceramic for thermistors according to claim 5, having a B constant of 1,000 K or below.

8. A semiconductor ceramic for thermistors according to claim 1, having a B constant of 1,000 K or below.

9. A chip-type thermistor comprising:

a thermistor element comprising the semiconductor ceramic according to claim 8; and a pair of electrodes on the thermistor element.

10. A chip-type thermistor comprising:

a thermistor element comprising the semiconductor ceramic according to claim 7; and a pair of electrodes on the thermistor element.

11. A chip-type thermistor comprising:

a thermistor element comprising the semiconductor ceramic according to claim 4; and a pair of electrodes on the thermistor element.

12. A chip-type thermistor comprising:

a thermistor element comprising the semiconductor ceramic according to claim 3; and a pair of electrodes on the thermistor element.

13. A chip-type thermistor comprising:

a thermistor element comprising the semiconductor ceramic according to claim 2; and a pair of electrodes on the thermistor element.

14. A chip-type thermistor comprising:

a thermistor element comprising the semiconductor ceramic according to claim 1; and a pair of electrodes on the thermistor element.

* * * * *